(12) United States Patent
Wang et al.

(10) Patent No.: US 11,417,375 B2
(45) Date of Patent: *Aug. 16, 2022

(54) DISCHARGE CURRENT MITIGATION IN A MEMORY ARRAY

(71) Applicant: Micron Technology, Inc., Boise, ID (US)

(72) Inventors: Hongmei Wang, Boise, ID (US); Jin Seung Son, McKinney, TX (US); Andrea Ghetti, Concorezzo (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/085,154

(22) Filed: Oct. 30, 2020

(65) Prior Publication Data

US 2021/0183421 A1 Jun. 17, 2021

Related U.S. Application Data

(63) Continuation-in-part of application No. 16/717,944, filed on Dec. 17, 2019, now Pat. No. 11,100,986.

(51) Int. Cl.
*G11C 8/08* (2006.01)
*G11C 7/12* (2006.01)

(52) U.S. Cl.
CPC . *G11C 8/08* (2013.01); *G11C 7/12* (2013.01)

(58) Field of Classification Search
CPC .. G11C 8/08; G11C 7/12; G11C 5/063; G11C 7/02; G11C 13/0026; G11C 13/003; G11C 7/18; G11C 11/4094; G11C 11/4097

USPC ........................................................ 365/148
See application file for complete search history.

(56) References Cited

U.S. PATENT DOCUMENTS

| 9,916,893 | B2 | 3/2018 | Liaw |
| 10,854,289 | B2 | 12/2020 | Antonyan et al. |
| 2010/0096628 | A1 | 4/2010 | Song et al. |
| 2016/0351233 | A1 | 12/2016 | Castro et al. |
| 2017/0294382 | A1 | 10/2017 | Briggs et al. |
| 2018/0374902 | A1 | 12/2018 | Castro |
| 2019/0088288 | A1 | 3/2019 | Tatsumura et al. |
| 2019/0096508 | A1 | 3/2019 | Kim et al. |

(Continued)

OTHER PUBLICATIONS http://hyperphysics.phy-astr.gsu.edu/hbase/Tables/elecon.html#c1 (Year: 1965).

(Continued)

*Primary Examiner* — Fernando Hidalgo
(74) *Attorney, Agent, or Firm* — Holland & Hart LLP

(57) ABSTRACT

Methods, systems, and devices for discharge current mitigation in a memory array are described. Access lines of a memory array may be divided into discrete segments, with each segment coupled with a driver for the access line by one or more vias respective to the segment. For example, a first segment of an access line may be coupled with a first set of memory cells, a second segment of the access line may be coupled with a second set of memory cells, and a driver may be coupled to the first segment by a first via and to the second segment by a second via. To access a memory cell in either the first set or the second, both the first segment of the access line and the second segment of the access line may be activated together by the common driver.

20 Claims, 7 Drawing Sheets

(56) References Cited

U.S. PATENT DOCUMENTS

| | | | |
|---|---|---|---|
| 2019/0140128 A1 | 5/2019 | Harmon | |
| 2019/0354653 A1 | 11/2019 | Weng et al. | |
| 2020/0020411 A1 | 1/2020 | Terada et al. | |
| 2020/0227476 A1* | 7/2020 | Tomita | G11C 13/0097 |
| 2020/0327935 A1* | 10/2020 | Kim | H01L 27/2481 |
| 2020/0365604 A1* | 11/2020 | Lai | H01L 27/11578 |
| 2020/0381037 A1* | 12/2020 | Kim | G11C 5/025 |
| 2021/0125926 A1* | 4/2021 | Le Bars | H01L 27/0207 |
| 2021/0159273 A1* | 5/2021 | Gupta | H01L 27/2436 |

OTHER PUBLICATIONS

ISA/KR, International Search Report and Written Opinion of the International Searching Authority, Int'l Appl. No. PCT/US2020/063100, dated Mar. 11, 2021, Korean Intellectual Property Office, Seo-gu, Daejeon, Republic of Korea, 11 pgs.

* cited by examiner

DISCHARGE CURRENT MITIGATION IN A MEMORY ARRAY

CROSS REFERENCE

The present Applications for Patent is a continuation-in-part of and claims priority to and the benefit of U.S. patent application Ser. No. 16/717,944 by WANG, entitled "DISCHARGE CURRENT MITIGATION IN A MEMORY ARRAY," filed Dec. 17, 2019, which is assigned to the assignee hereof and expressly incorporated by reference in its entirety herein.

BACKGROUND

The following relates generally to one or more memory systems and more specifically to discharge current mitigation in a memory array.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
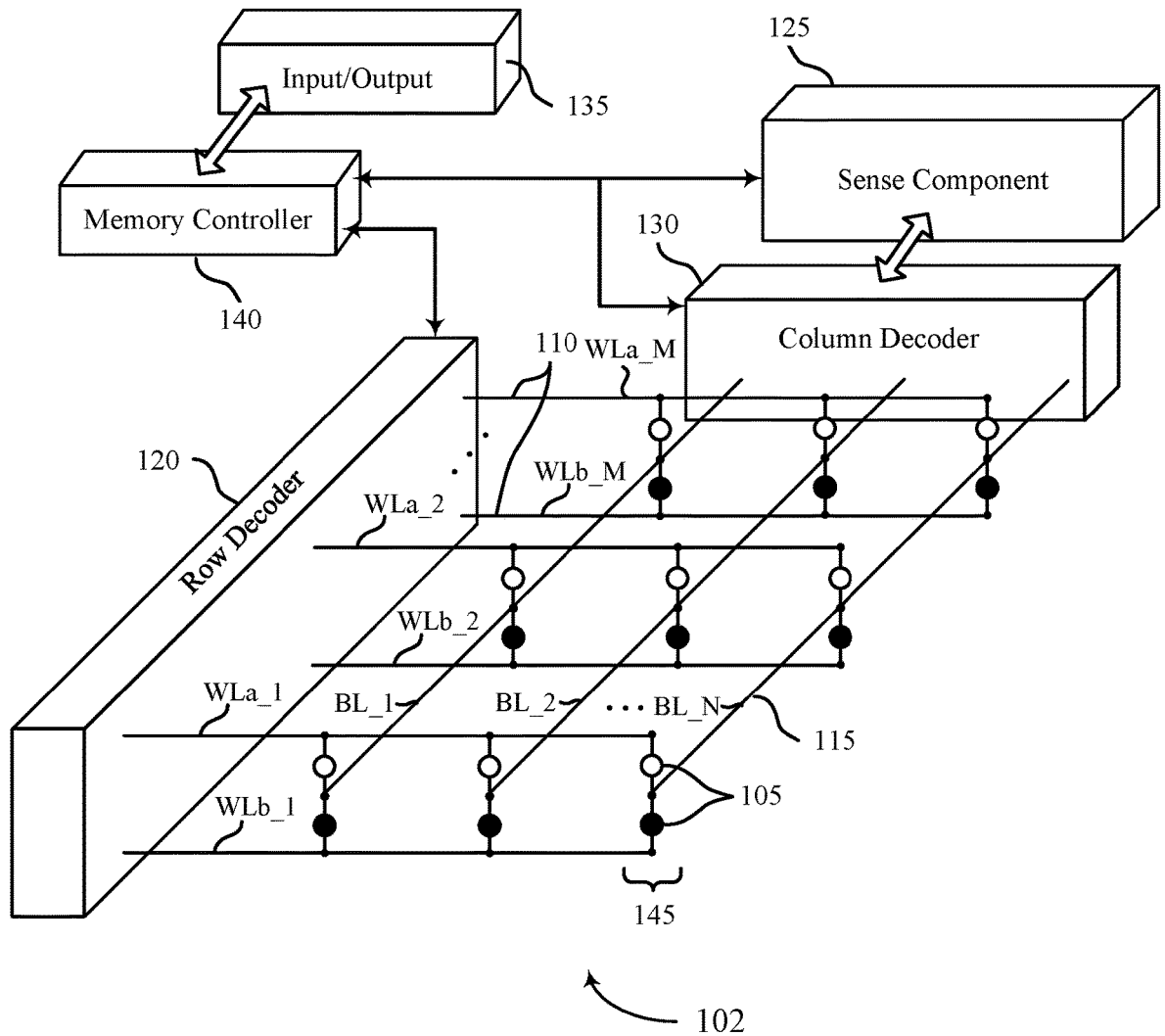
FIG. 1 illustrates an example of a memory die that supports discharge current mitigation in a memory array in accordance with examples as disclosed herein.

In some memory arrays, current discharges through a memory cell may result in current "spikes" (e.g., relatively high current discharge through the memory cell in a relatively short time period), which may cause damage to the memory cell. Some such spikes may result from external discharge, which may refer to the discharge of parasitic capacitances or other sources that are external to the memory array (e.g., peripheral circuitry). Additionally or alternatively, such spikes may result from internal discharge, which may refer to the discharge of parasitic capacitances or other sources within the memory array. Current spikes due to internal discharge may be particularly problematic as, for example, mitigation circuits or other techniques may be more readily applied to mitigate the impact of external discharge.

For example, various voltages of the memory array may be altered to perform access operations. The various voltage alterations may cause charge in the memory array to build up, for example, in the parasitic capacitances associated with the array (e.g., the parasitic capacitances of the access lines of the memory array). In some cases, the built-up charge may discharge through a selected memory cell. For example, a memory cell may become conductive based on being selected (e.g., when accessed, such as when a voltage across the memory cell crosses a threshold voltage of the memory cell), which may allow built-up charge on the access lines coupled with the memory cell to discharge through the cell in a current spike. The memory cell may be degraded or worn out in proportion to the number and magnitude of current spikes experienced by the memory cell over time.

In some cases, current spikes may be higher for memory cells located close or near to a contact of the access line driver (i.e., a near electrical distance (ED)) than for memory cells located far from the contact of the access line driver (i.e., a far ED). For example, discharge through a memory cell with a near ED may be more severe due to a relatively lower resistance path between the memory cell and the charge built up in parasitic capacitances along the entire length of the access line, which may result in a higher amount of current through the memory cell when the memory cell becomes conductive (e.g., a relatively higher magnitude current spike) than for memory cells with far ED, which may be more separated from charge built up along farther away portions of the access line (e.g., charge built up far along the access line on the other side of the contact).

Techniques for mitigating discharge current in a memory array are described herein. Access lines of the memory array may be cut (severed, segmented, divided) into segments. In some cases, an overall tile size or other size associated with the memory array may not be altered. Each access line may be driven by a corresponding access line driver. For a segmented access line, each segment of the access line may be coupled with the same access line driver corresponding to the access line, but with a via that is respective to the segment. In other words, the access line driver may be coupled with multiple vias, each of the multiple vias corresponding to a respective segment of the access line that corresponds to the driver. Such segmented access lines may enable reduced current discharge through memory cells of the access line. For example, when a memory cell is accessed (e.g., selected via the access line), a signal path from one segment of the access line to another segment of the access line may go through the multiple vias connecting the different segments to the bit line driver, which may introduce additional length and resistance into the signal path. Thus, the length of the signal path, the resistance of the signal path, or both may be extended, which may reduce the magnitude of a current spike through an accessed memory cell.

Features of the disclosure are initially described in the context of memory dies and arrays as described with reference to FIGS. 1 and 2. Features of the disclosure are described in the context memory architectures as described with reference to FIGS. 3 through 5. These and other features of the disclosure are further illustrated by and described with reference to an apparatus diagram and flowcharts that relate to discharge current mitigation in a memory array as described with references to FIGS. 6 and 7.

FIG. 1 illustrates an example memory device 100 in accordance with examples as disclosed herein. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, and not necessarily actual physical positions within the memory device 100. In the illustrative example of FIG. 1, the memory device 100 includes a three-dimensional (3D) memory array 102. The 3D memory array 102 includes memory cells 105 that may be programmable to store different states. In some examples, each memory cell 105 may be programmable to store one of two states, denoted as a logic 0 and a logic 1. In some examples, a memory cell 105 may be configured to store one of more than two logic states. Although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays formed on top of one another. This may increase a number of memory cells that may be placed or created on a single die or substrate as compared with 2D arrays, which in turn may reduce production costs, or increase the performance of the memory device, or both. The memory array 102 may include two levels of memory cells 105 and may thus be considered a 3D memory array; however, the number of levels is not limited to two and may in some cases be one or more than two. Each level may be aligned or positioned so that memory cells 105 may be aligned (exactly, overlapping, or approximately) with one another across each level, forming a memory cell stack 145. In some cases, the memory cell stack 145 may include multiple memory cells 105 laid on top of another while sharing an access line. The memory cells 105 may in some cases be configured to each store one bit of data.

A memory cell 105 may, in some examples, be a self-selecting memory cell, a phase change memory (PCM) cell, and/or another type of resistive or threshold-based memory cell. A self-selecting memory cell 105 may include one or more components of a material (e.g., a chalcogenide material) that each function both as a storage element and as a cell selector (selection) element, thereby eliminating the need for separate cell selector circuitry (a selector circuitry that does not contribute to storage). Such an element may be referred to as a storage and selector component (or element), or as a self-selecting memory component (or element). In contrast, other types of memory cells, such as random access memory (RAM) (e.g., dynamic RAM (DRAM)) or PCM cells, may each include a separate (dedicated) cell selector element such as a three-terminal selector element (e.g., a transistor) to contribute to the selection or non-selection of the memory cell without contributing to the storage of any logic state.

Memory array 102 may include multiple word lines 110 (e.g., row lines) for each deck (e.g., labeled WLa_1 through WLa_M for a first set of word lines at a first deck and WLb_1 through WLb_M for a second set of word lines at second deck) and multiple bit lines 115 (e.g., column lines), labeled BL_1 through BL_N, where M and N depend on the array size. In some examples, each row of memory cells 105 is connected to a word line 110, and each column of memory cells 105 is connected to a bit line 115. In some cases, word lines 110 and bit lines 115 may generically be referred to as access lines because they may permit access to memory cells 105. In some examples, bit lines 115 may also be known as digit lines 115. References to access lines, word lines, and bit lines, or their analogues, are interchangeable without loss of understanding or operation. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively doped semiconductors, or other conductive materials, alloys, compounds, or the like.

Word lines 110 and bit lines 115 may be substantially perpendicular (i.e., orthogonal) to one another or otherwise intersect one another to create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third layer may share an access line 110 with a lower layer. In general, one memory cell 105 may be located at the intersection of two conductive lines such as a word line 110 and a bit line 115. This intersection may be referred to as an address of a memory cell 105. A target memory cell 105 may be a memory cell 105 located at the intersection of an energized word line 110 and bit line 115; that is, word line 110 and bit line 115 may be energized to read or write a memory cell 105 at their intersection. Other memory cells 105 that are in electronic communication with (e.g., connected to) the same word line 110 or bit line 115 may be referred to as untargeted memory cells 105.

Electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some examples, a memory cell 105 may include multiple self-selecting or other memory components (e.g., a selection component and a storage component) separated from each other and from access lines 110, 115 by electrodes. As previously noted, for self-selecting memory cells 105, a single component (e.g., a section or layer of chalcogenide material within the memory cell 105) may be used as both a storage element (e.g., to store or contribute to the storage of a state of memory cell 105) and as a selector element (e.g., to select or contribute to the selection of the memory cell 105).

The electrodes within a memory cell stack 145 may each be of a same material (e.g., carbon) or may be of various (different) materials. In some cases, the electrodes may be a different material than the access lines. In some examples, the electrodes may shield a material (e.g., a chalcogenide material) included in a self-selecting or other memory component from the word line 110, from the bit line 115, and from each other to prevent chemical interaction between the material and the word line 110, the bit line 115, or another memory component.

Operations such as reading and writing may be performed on memory cells 105 by activating or selecting a corresponding word line 110 and bit line 115. Accessing memory cells 105 may be controlled through a row decoder 120 and a column decoder 130. For example, a row decoder 120 may receive a row address from the memory controller 140 and activate the appropriate word line 110 based on the received row address. Such a process may be referred to as decoding a row or word line address. Similarly, a column decoder 130 may receive a column address from the memory controller 140 and activate the appropriate bit line 115. Such a process may be referred to as decoding a column or bit line address. A row decoder 120 and/or column decoder 130 may be examples of decoders implemented using decoder circuitry, for example. In some cases, row decoder 120 and/or column decoder 130 may include charge pump circuitry that is configured to increase a voltage applied to a word line 110 or bit line 115 (respectively).

A memory cell 105 may be read (e.g., sensed) by a sense component 125 when the memory cell 105 is accessed (e.g., in cooperation with the memory controller 140, row decoder 120, and/or column decoder 130) to determine a logic state stored by the memory cell 105. The sense component 125 may provide an output signal indicative of (e.g., based at least in part on) the logic state stored by the memory cell 105 to one or more components (e.g., to the column decoder 130, the input/output component 135, the memory controller 140). In some examples, the detected logic state may be provided to a host device (e.g., a device that uses the memory device 100 for data storage, a processor coupled with the memory device 100 in an embedded application), where such signaling may be provided directly from the input/output component 135 or via the memory controller 140.

In some examples, the memory controller 140 may control the accessing of memory cells 105 through the various components (e.g., row decoder 120, column decoder 130, sense component 145). In some examples, one or more of the row decoder 120, column decoder 130, and sense component 145 may be co-located with the memory control 140. The memory controller 140 may be operable to receive one or more of commands or data from one or more different memory controllers (e.g., an external memory controller associated with a host device, another controller associated with the memory device 100), translate the commands or the data (or both) into information that can be used by the memory device 100, perform one or more operations on the memory device 100, and communicate data from the memory device 100 to a host device (not shown) based on performing the one or more operations. The memory controller 140 may generate row signals and column address signals to activate the target word line 110 and the target digit line 115. The memory controller 140 may also generate and control various voltages or currents used during the operation of the memory device 100. In general, the amplitude, the shape, or the duration of an applied voltage or current discussed herein may be varied and may be different for the various operations discussed in operating the memory device 100.

In some examples, a host device (not shown) may communicate with the memory controller 140. For example, the memory controller 140 may receive commands from the host device and may perform one or more operations to the memory device 100. Such operations may include executing access operations based on the received commands. Examples of access operations may include a write operation, a read operation, a refresh operation, a precharge operation, or an activate operation, among others. The memory controller 140 may be operable to perform other access operations not listed here or other operations related to the operating of the memory device 100 that are not directly related to accessing the memory cells 105.

Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. An ordinary person skilled in the art would appreciate that sense component may be associated either with column decoder or row decoder without losing its functional purpose.

In some memory architectures, accessing a memory cell 105 may degrade or destroy a logic state stored by one or more memory cells 105, and rewrite or refresh operations may be performed to return the original logic state to the memory cells 105. In architectures that include a material portion for logic storage, for example, sense operations may cause a change in the atomic configuration or distribution of a memory cell 105, thereby changing the resistance or threshold characteristics of the memory cell 105. Thus, in some examples, the logic state stored in a memory cell 105 may be rewritten after an access operation.

In some examples, reading a memory cell 105 may be non-destructive. That is, the logic state of the memory cell 105 may not need to be rewritten after the memory cell 105 is read. For example, in architectures that include a material portion for logic storage, sensing the memory cell 105 may not destroy the logic state and, thus, a memory cell 105 may not need rewriting after accessing. However, in some examples, refreshing the logic state of the memory cell 105 may or may not be needed in the absence or presence of other access operations. For example, the logic state stored by a memory cell 105 may be refreshed at periodic intervals by applying an appropriate write or refresh pulse or bias to maintain stored logic states. Refreshing a memory cell 105 may reduce or eliminate read disturb errors or logic state corruption.

Though illustrated to the side of the memory array 102 for clarity, the row decoder 120 and column decoder 130 may in some cases be below the memory array 102. Each decoder 120, 130 may include or be coupled with one or more drivers configured to drive the access lines 110, 115 to desired voltages (e.g., to access one or more associated memory cells 105). As an example, each of the word lines WLa_1 through WLa_M may be coupled with a respective driver from a first set of drivers associated with the row decoder 120, and each of the word lines WLb_1 through WLb_M may be coupled with a respective driver from a second set of drivers associated with the row decoder 120, although other configurations are possible. In some cases, the drivers may be distributed throughout an area under the memory array 102. Vias may extend through one or more layers or decks of the memory device 100 to couple the drivers with their corresponding access lines 110, 115. For example, if the access lines 110, 115 are considered to extend in horizontal directions (e.g., an x direction or a y direction), vias may extend in a vertical (z) direction. In some cases, one or more layers between the drivers and the access lines may include metal routing lines, which may be referred to as interconnect layers or collectively as an interconnect layer, where drivers may be coupled with corresponding lines in the interconnect layer and vias may extend between the interconnect layer and the layers that include the access lines 110, 115.

In some examples, voltages within the memory device 100 may vary as part of one or more memory operations (e.g., access operations). For example, components of the memory device 100 (e.g., the memory controller 140, row decoder 120, and column decoder 130 or associated drivers) may increase or decrease the voltages of word lines 110 and digit lines 115 relative to one another in order to access (e.g., read or write) the memory cells 105. As voltages within the memory device 100 vary, charge may build up internal to the memory array (e.g., charge may be stored in the parasitic capacitances of word lines 110 and digit lines 115). When a memory cell 105 becomes conductive (e.g., because the voltage across the memory cell 105 exceeds a threshold voltage of the memory cell, such as during an access operation for the memory cell 105), the charge stored in the parasitic capacitances of the word line 110 or digit line 115 coupled with the memory cell 105 may discharge through the memory cell 105, resulting in a current spike through the memory cell 105. The memory cell 105 may be degraded or worn out in proportion to the number and magnitude of current spikes experienced by the memory cell.

According to some examples described herein, the access lines of the memory array may be cut into segments. For example, the word lines 110 and/or the digit lines 115 may include two or more segments, respectively. Each segment of an access line may be coupled with an access line driver using at least one respective via—for example, a first segment may be coupled with a driver by a first via, and a second segment may be coupled with the driver by a second via, and so on. Such segments may enable mitigated current discharge through memory cells 105 of the access lines. For example, when a memory cell 105 is accessed (e.g., during a write operation, a read operation, a refresh operation, and the like), a signal path (i.e., a discharge path) from one segment of the access line to another segment of the access line may route through the vias connecting each segment to an interconnect layer (e.g., a conductive line or other structure associated with the array). Such a configuration may result in a resistor ballast, which may mitigate the current spike (e.g., increase the amount of time for current to dissipate from the parasitic capacitance of the access line) due in part to the relatively longer length and relatively higher resistance of the discharge path through a memory cell 105. For example, when a memory cell coupled with one segment of an access line is accessed, charge built up along a different segment of the access line may have to traverse a longer and more resistive signal path and thus may provide a reduced contribution to the current spike through the accessed memory cell.

Figure 2:
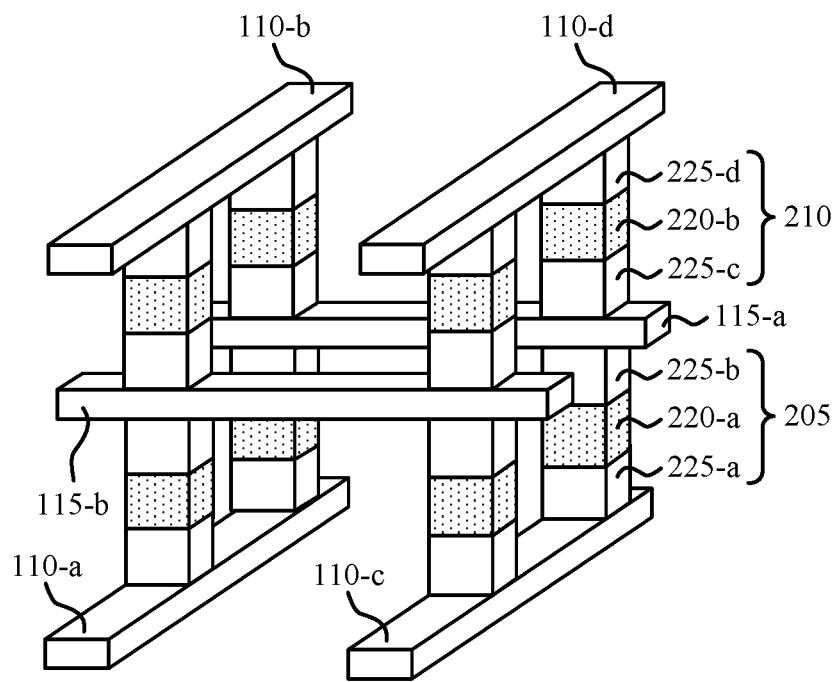
FIG. 2 illustrates an example of a memory array that supports discharge current mitigation in a memory array in accordance with examples as disclosed herein.

FIG. 2 illustrates an example of a memory array 200 in accordance with examples as disclosed herein. Memory array 200 may be an example of portions of the memory die described with reference to FIG. 1. The memory array 200 may include a first deck 205 of memory cells that is positioned above a substrate and second deck 210 of memory cells on top of the first array or deck 205. Though the example of memory array 200 includes two decks 205, 210, the memory array 200 may include any quantity of decks (e.g., one or more than two).

Memory array 200 may also include a row line 110-a, a row line 110-b, a row line 110-c, a row line 110-d, a column line 115-a, and a column line 115-b which may be examples of word lines 110 and digit lines 115, as described with reference to FIG. 1. One or more memory cells of the first deck 205 and the second deck 210 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. In some cases, a chalcogenide material may be configured to provide both selection and storage functionality, and a component that includes such a chalcogenide material may be referred to as self-selecting. Although some elements included in FIG. 2 are labeled with a numeric indicator, other corresponding elements are not labeled, although they are the same or would be understood to be similar, in an effort to increase visibility and clarity of the depicted features.

Memory cells of the first deck 205 may each include one or more of an electrode 225-a, a storage element 220-a, or an electrode 225-b. Memory cells of the second deck 210 may each include one or more of an electrode 225-c, a storage element 220-b, and an electrode 225-d. The storage elements 220 may each be an example of an elements that includes a chalcogenide material, such as a phase change storage element or a self-selecting storage element. The memory cells of the first deck 205 and second deck 210 may, in some examples, have common conductive lines such that corresponding memory cells of one or more decks 205 and one or more decks 210 may share column lines 115 or row lines 110. For example, the first electrode 225-c of the second deck 210 and the second electrode 225-b of the first deck 205 may be coupled with column line 115-a such that the column line 115-a may be shared by vertically adjacent memory cells.

In some examples, the material of the storage element 220 may include a chalcogenide material or other alloy, such as a material including selenium (Se), tellurium (Te), arsenic (As), antimony (Sb), carbon (C), germanium (Ge), silicon (Si), or indium (IN), gallium (Ga), palladium (Pd), sulfur (S), or various combinations thereof. In some examples, the material of the storage element 220 may be a chalcogenide glass and may include additional elements such as hydrogen (H), oxygen (O), nitrogen (N), chlorine (Cl), or fluorine (F), each in atomic or molecular forms. It is to be understood that these are examples only and that the claims are not so-limited.

In some examples, a storage element 220 may be an example of a phase change memory element. In such examples, the material used in the storage element 220 may be based on an alloy (such as the alloys listed above) and may be operated so as to undergo a phase change or change to different physical state during normal operation of the memory cell. For example, a phase change memory cell may be switched between an amorphous state and a crystalline state (or between one or more relatively amorphous states and one or more relatively crystalline states).

Phase change memory cells may exhibit an observable difference between resistances or threshold voltages of a crystalline state and an amorphous state in phase change materials, which may be chalcogenide materials. A material in the crystalline state may have atoms arranged in a periodic structure, which may result in a relatively low electrical resistance or threshold voltage. By contrast, a material in an amorphous state may have no or relatively little periodic atomic structure, which may have a relatively high electrical resistance or threshold voltage.

The difference in resistance values or threshold voltages between amorphous and crystalline states of a material may be substantial. For example, a material in an amorphous state may have a resistance one or more orders of magnitude greater than the resistance of the material in its crystalline state. In some examples, the material may be partially amorphous and partially crystalline, and the resistance or threshold voltage may be of some value between the resistances or threshold voltages of the material in a wholly crystalline or wholly amorphous state. In such examples, a material may be used to store more than two logic states (e.g., three or more logic states).

During a programming (write) operation of a phase change memory cell (e.g., electrode 225-*a*, storage element 220-*a*, electrode 225-*b*), the various parameters of the programming pulse may influence (e.g., determine, set, program) a particular behavior or characteristic of the material of the storage element 220, such as the threshold voltage of the material or the resistance of the material. To program a low-resistance or low-threshold voltage state (e.g., a relatively crystalline state) in the phase change memory cell, a programming pulse may be applied that heats or melts the material of the storage element 220, which may be associated with forming, at least temporarily, a relatively disordered (e.g., amorphous) atomic arrangement. The amplitude of the programming pulse may be reduced (e.g., relatively slowly) over a duration to allow the material to form crystalline structures as it cools, thereby forming a stable crystalline material state. To program a high-resistance or high-threshold voltage state (e.g., a relatively amorphous state) in the phase change memory cell, a programming pulse may be applied that heats and/or melts the material of the storage element 220. The amplitude of the programming pulse may be reduced more quickly than the programming pulse for the low-resistance or low-threshold voltage state. In such scenarios, the material may cool with atoms in a more disordered atomic arrangement because the atoms were not able to form crystalline structures before the material reached a stable state, thereby forming a stable amorphous material state. The difference in threshold voltages or resistances of the material of the storage element 220 depending on the logic state stored by the material of the storage element 220 may correspond to the read window of the storage element 220. In some cases, a portion of a storage element may undergo a material change associated with the logic states.

In some examples, such as for self-selecting memory cells, some or all of the set of logic states supported by the memory cells may be associated with an amorphous state of the chalcogenide material (e.g., the material may be operable to store different logic states without changing phase). For example, a logic state '0' and a logic state '1' may both be associated with an amorphous state of the chalcogenide material. In some examples, the storage element 220 may be an example of a self-selecting memory cell. In such examples, the material used in the storage element 220 may be an alloy (such as the alloys listed above) and may be operated so as to not undergo a phase change (e.g., may not undergo a change between a relatively crystalline state and a relatively amorphous state) during normal operation of the memory cell. For example, the material of the storage element 220 may include a chemical element, such as arsenic, that inhibits the chalcogenide material from changing states and thus may remain in a single state (e.g., an amorphous state or a crystalline state).

During a programming (write) operation of a self-selecting memory cell (e.g., including electrode 225-*a*, storage element 220-*a*, and electrode 225-*b*), a polarity used for a write operation may influence (determine, set, program) a particular behavior or characteristic of the material of the storage element 220, such as the threshold voltage of the material when read using a given polarity (e.g., when read using a same polarity as the write voltage versus when read using a different polarity than the write voltage). The difference in the observed threshold voltages of the material of the storage element 220 depending on the logic state stored by the material of the storage element 220 (e.g., the difference between the threshold voltage when the material is storing a logic state '0' versus a logic state '1') may correspond to the read window of the storage element 220.

The architecture of memory array 200 may be referred to as a cross-point architecture, in some examples, in which a memory cell is formed at a topological cross-point between a row line 110 and a column line 115. For example, the architecture of the memory array 200 may be referred to as or be an example of aspects of a resistive RAM (RRAM) cross-point memory array or ferroelectric RAM (FeRAM) cross-point memory array, among other examples of memory types for which a cross-point architecture may be used. Such a cross-point architecture may offer relatively high-density data storage with lower production costs compared to at least some other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture. Alternatively, DRAM memory cells may include the cell selector elements underneath the memory cells.

While the example of FIG. 2 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 2 may be electrically coupled with one another as shown or described but rearranged physically (e.g., a storage element 220 and possibly a selection element or electrode 225 may be electrically in series between a row line 110 and a column line 115 but need not be in a pillar or stack configuration).

In some examples, voltages of different components within the memory array 200 may vary as part of one or more memory operations (e.g., access operations). In such examples, charge may build up internal to the memory array 200 (e.g., the parasitic capacitances of word lines 110 and digit lines 115 may build up charge). The charge may result in a current spike through one or more memory cells (e.g., included in memory deck 210 and/or memory deck 205), which may cause damage to the memory cells. For example, a memory cell may become conductive based on being selected, which may enable any built-up charge on the access lines to discharge through the memory cell in a current spike. The current spike may contribute to degradation or wear-out of the memory cell.

According to some examples described herein, the memory array may include access lines each cut into discrete segments. For example, the word lines 110 and/or the digit lines 115 may each include two or more segments, respectively. Each segment of an access line may be coupled with a same access line driver (a driver for the access line) but through different vias. Thus, all segments of an access line may be driven (e.g., have their voltages increased or decreased) together (concurrently), but with through different interconnections with the common driver.

Such segmented access lines may mitigate current discharge through memory cells. For example, when a memory cell coupled with one segment of an access line is accessed (e.g., the storage element 220 becomes conductive based on selecting a memory cell using a word line 110 and a digit line 115), current discharge from the parasitic capacitances associated with any other segment of the access line may follow an improved signal path before discharging through the accessed memory cell. The improved signal path may include a path from another segment of the access line, through at least one via or conductive line (e.g., a conductive line of an interconnect layer), to the segment coupled with the accessed cell. Such a configuration may result in a resistor ballast, which may mitigate the current spike due in part to the relatively longer length and relatively higher resistance of the signal path to the memory cell.

Figure 3:
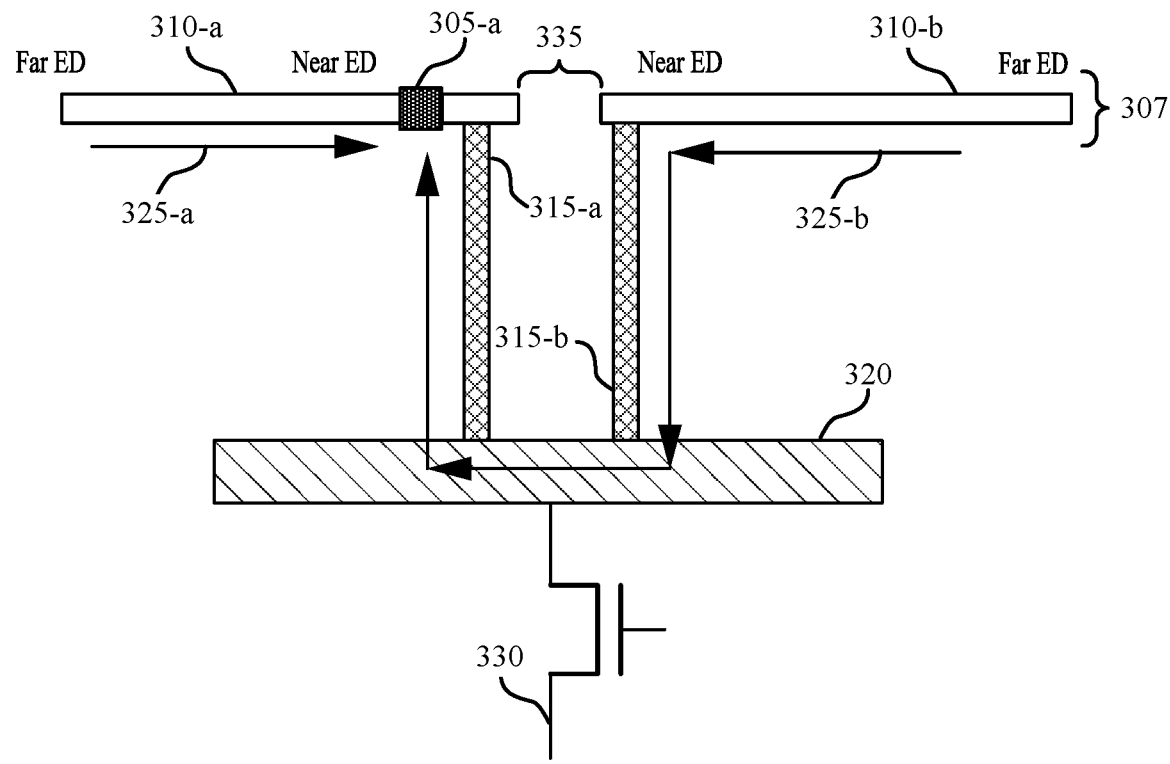
FIGS. 3-5 illustrate examples of memory architectures that supports discharge current mitigation in a memory array in accordance with examples as disclosed herein.

FIG. 3 illustrates an example of a memory architecture 300 that supports discharge current mitigation in a memory array in accordance with examples as disclosed herein. In some cases, the memory architecture 300 may implement one or more features of the memory device 100 as described with reference to FIG. 1 and/or the memory array 200 as described with reference to FIG. 2. The memory architecture 300 may show a cross section schematic of a portion of a memory array that supports discharge current mitigation as described herein.

The memory architecture 300 may include any number of memory cells 305 (though only one is shown in FIG. 3 for illustrative clarity), which may be examples of memory cells 105 as described with reference to FIGS. 1 and 2. The memory cell 305-a may be referred to as a target memory cell (e.g., when the memory cell 305-a is selected as part of an access operation). The target memory cell 305-a, along with any number of other memory cells 305, maybe coupled with an access line 307. The access line 307 may be a word line or a bit line as described herein, for example. The target memory cell 305-a may also be coupled with at least one other access line (not shown), but only the one access line 307 is shown in FIG. 3 for illustrative clarity.

As described herein, the memory architecture 300 may be configured to mitigate current spikes that may degrade or damage the memory cells 305. For example, internal charge may build up on the access lines coupled with the targeted memory cells 305-a (e.g., the parasitic capacitance of the access line 307 may accumulate stored charge). In some examples, the built up charge may discharge through the memory cell 305-a (e.g., when the memory cell 305-a is selected and becomes conductive as part of an access operation), which may result in a relatively high current spike that may damage the memory cell 305-a.

Accordingly, the memory architecture 300 may be configured to mitigate the current spike through the memory cells 305. For example, the access line 307 may be cut into one or more segments 310 (e.g., the segment 310-a and a segment 310-b, or any number of segments 310). For example, during the formation of the memory array a processing step (e.g., a chop mask) may be used to create a break in the access line 307 (e.g., to cut out one or more gaps 335 and form the segments 310). Each segment 310 may be associated with (e.g., coupled with) one or more memory cells 305. In some examples, the access line 307 may be associated with a physical address within the memory array, such as a row address or column address, and the segments 310 may not be individually addressable but may instead each be accessed based on the address of the access line 307, such that an access operation to any memory cell 305 on the access line will address all of the segments 310 of the access line.

The segments 310 may each be coupled with one or more respective vias 315. For example, the segment 310-a may be coupled with a via 315-a, and the segment 310-b may be coupled with a via 315-b. In some examples, the vias 315 may extend in a different direction than the access lines. For example, the vias 315 may extend through layers or decks of a memory device, which may be referred to as a vertical direction (or z direction) for clarity, and access lines (e.g., word lines 110 and digit lines 115) may extend horizontally (e.g., in an x or y direction) within respective layers or decks of the memory device. The vias 315 may carry signals to and from the access lines (e.g., signals from the driver 330). Although the example of FIG. 3 illustrates each segment 310 as coupled to one respective via 315, other configurations are possible (e.g., multiple vias 315 coupled to each segment 310, among other examples). Additionally, the location of the vias 315 may vary. For example, although FIG. 3 shows that via 315-a contacts the segment 310-a near the right end of the segment 310-a and the via 315-b contacts the segment 310-b near the left end of the segment 310-b—and thus, each via 315 contacts the access line 307 relatively near the midpoint of the access line 307—a via 315 may be coupled with a segment 310 at any location along the segment 310.

In some cases, one or more layers between the access line 307 and the driver 330 for the access line 307 may include conductive (e.g., metal) routing lines, which may be referred to as interconnect layers or collectively as an interconnect layer 320. The interconnect layer may serve to route signals from components under the memory array to components within the memory array such that the driver 330 need not be located directly under the access line 307. In some cases, the routing lines within the interconnect layer 320 may extend in a direction parallel to the access line 307 (e.g., in a horizontal direction). In some cases, a via 315 may couple a segment 310 to one or more routing lines within the interconnect layer 320, and the output of the driver 330 for the access line may also be coupled with the one or more routing lines within the interconnect layer 320 (that is, the via 315 may be coupled with the output of the driver 330 by the one or more routing lines within the interconnect layer 320).

The driver 330, although illustrated as a single transistor for clarity, may be any circuitry configured to drive the line to a desired voltage and may include any number of transistors or other circuitry components. In some cases, the driver 330 may be coupled with or included in a corresponding decoder (e.g., a row decoder 120 or a column decoder 130). The driver 330 may drive the access line segments 310 to a desired voltage using the layer 320 and the corresponding vias 315 (e.g., the via 315-a may electrically connect voltages or currents from the driver 330 to the access line segment 310-a). The driver 330 may be configured to apply a current and/or a voltage to the access lines of a memory cell as part of an access operation (e.g., the memory device, such as a memory controller 140, may operate the driver 330 to select a word line 110 or a digit line 115 by applying a current and a voltage). In some examples, the driver 330 may be an example of a word line driver or a bit line driver. Further, although illustrated as below (e.g., lower than) the layer 320, the driver 330 may in some cases be located in various other physical configurations within or around the elements of memory architecture 300.

The memory architecture 300 may include a gap 335 between the segment 310-a and the segment 310-b. The gap 335 may be filled by a material such as a non-conductive material (e.g., a dielectric material) or another suitable (e.g., electrically insulating) material such that current discharge is at least partially inhibited from flowing directly from the segment 310-b to the segment 310-a. Alternatively, the gap 335 may be an unfilled space between the segment 310-a and the segment 310-b. As discussed herein, the gap 335 may be formed using any number of masking or etching processes, such as using a chop mask during the formation of the memory array. In some examples, the gap may not be in the middle of the access line 307 as illustrated (e.g., such that the segment 310-a and the segment 310-b are equal in length), and may instead be placed elsewhere in the memory architecture 300 (e.g., such that the segment 310-a and the segment 310-b are different in length).

In the example schematic illustrated by the memory architecture 300, charge associated with a current spike through the target memory cell 305-a (e.g., due to a thresholding of the target memory cell 305-a) may flow through discharge paths 325, which may mitigate (e.g., reduce) the magnitude of the current spike through the memory cell 305-a. For example, internal charge that may build up on the access line 307 may follow the discharge paths 325 to discharge through the target memory cell 305-a to another access line coupled with the target memory cell 305-a. The other access line (not shown) may, for example, be a bit line if the access line 307 is a word line, or may be a word line if the access line 307 is a bit line.

The discharge path 325-a may illustrate a path taken by charge distributed on the segment 310-a of the access line before passing through the memory cell 305-a. The discharge path 325-b may illustrate a path taken by charge distributed on the segment 310-b (i.e., a segment not directly coupled with the memory cell 305-a) before passing through the memory cell 305-a. The discharge path 325-b may route through the via 315-b, the layer 320, the via 315-a, and then through the segment 310-a before the current discharges through the memory cell 305-a. The extra ED and resistance introduced by the vias 315-b, the interconnect layer 320, and the via 315-b may mitigate (reduce) the contribution of the charge associated with the segment 310-b to the discharge current through the memory cell 305-a.

In some examples, the resistivity of the vias 315 may be different (e.g., higher) than the resistivity of the access line (e.g., the resistivity of the segment 310-a and the segment 310-b). For example, the vias 315 may be made of one or more different materials than the access line, the vias 315 may have different physical properties (e.g., physical dimensions such as cross-sectional area), or both.

The discharge path 325-b may introduce a resistance ballast including the vias 315 and the layer 320. That is, due to the relatively long length and corresponding resistance of the discharge path 325-b (e.g., rather than charge flowing directly from the segment 310-b to the segment 310-a), current spikes through the memory cell 305-a may be reduced as some of the charge dissipates and/or discharges more slowly through the memory cell 305-a (e.g., such that an amplitude of the current discharge is reduced). By reducing the amplitude (e.g., peak amplitude, average amplitude) of current discharged through the memory cell 305-a when the memory cell 305-a is accessed, the lifespan of the memory cell 305-a may be extended and the chance of damage occurring to the memory cell 305-a may be reduced, among other benefits that may be appreciated by one of ordinary skill in the art.

Figure 4:
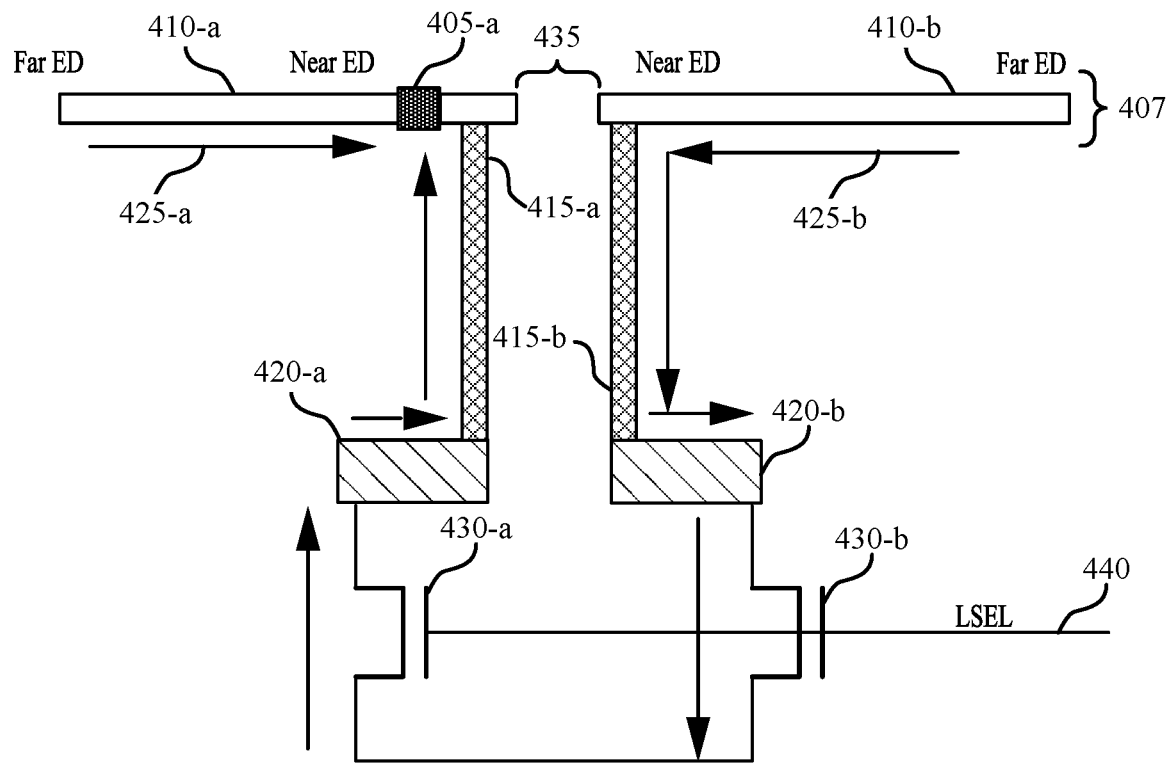

FIG. 4 illustrates an example of a memory architecture 400 that supports discharge current mitigation in a memory array in accordance with examples as disclosed herein. In some cases, the memory architecture 400 may implement one or more features of the memory device 100 as described with reference to FIG. 1, the memory array 200 as described with reference to FIG. 2, or the memory array 300 as described with reference to FIG. 3. The memory architecture 400 may show an example of a cross section schematic of a portion of a memory array that supports discharge current mitigation as described herein.

The memory architecture 400 may include any number of memory cells 405 (though only one is shown in FIG. 4 for illustrative clarity), which may be examples of memory cells 105 as described with reference to FIG. 1. The memory cell 405-a may be referred to as a target memory cell (e.g., when the memory cell 405-a is selected as part of an access operation). The target memory cell 405-a, along with any number of other memory cells 405, maybe coupled with an access line 407. The access line 407 may be a word line or a bit line as described herein, for example. The target memory cell 405-a may also be coupled with at least one other access line (not shown), but only the one access line 407 is shown in FIG. 4 for illustrative clarity.

As described herein, the memory architecture 400 may be configured to mitigate current spikes that may degrade or damage the memory cells 405. For example, internal charge may build up on the access lines coupled with the targeted memory cells 405-a (e.g., the parasitic capacitance of the access line 407 may accumulate stored charge). In some examples, the built up charge may discharge through the memory cell 405-a (e.g., when the memory cell 405-a is selected and becomes conductive as part of an access operation), which may result in a relatively high current spike that may damage the memory cell 405-a.

Accordingly, the memory architecture 400 may be configured to mitigate the current spike through the memory cells 405. For example, the access line 407 may be cut into one or more segments 410 (e.g., the segment 410-a and a segment 410-b, or any number of segments 410). For example, during the formation of the memory array a processing step (e.g., a chop mask) may be used to create a break in the access line 407 (e.g., to cut out one or more gaps 435 and form the segments 410). Each segment 410 may be associated with (e.g., coupled with) one or more memory cells 405. In some examples, the access line 407 may be associated with a physical address within the memory array, such as a row address or column address, and the segments 410 may not be individually addressable but may instead each be accessed based on the address of the access line 407, such that an access operation to any memory cell 405 on the access line will address all of the segments 410 of the access line.

The segments 410 may each be coupled with one or more respective vias 415. For example, the segment 410-a may be coupled with a via 415-a, and the segment 410-b may be coupled with a via 415-b. In some examples, the vias 415 may extend in a different direction than the access lines. For example, the vias 415 may extend through layers or decks of a memory device, which may be referred to as a vertical direction (or z direction) for clarity, and access lines (e.g., word lines 110 and digit lines 115) may extend horizontally (e.g., in an x or y direction) within respective layers or decks of the memory device. The vias 415 may carry signals to and from the access lines (e.g., signals from the driver 430). Although the example of FIG. 4 illustrates each segment 410 as coupled to one respective via 415, other configurations are possible (e.g., multiple vias 415 coupled to each segment 410, among other examples). Additionally, the location of the vias 415 may vary. For example, although FIG. 4 shows that via 415-a contacts the segment 410-a near the right end of the segment 410-a and the via 415-b contacts the segment 410-b near the left end of the segment 410-b—and thus, each via 415 contacts the access line 407 relatively near the midpoint of the access line 407—a via 415 may be coupled with a segment 410 at any location along the segment 410.

The memory architecture 400 may include a gap 435 between the segment 410-a and the segment 410-b. The gap 435 may be filled by a material such as a non-conductive material (e.g., a dielectric material) or another suitable (e.g., electrically insulating) material such that current discharge is at least partially inhibited from flowing directly from the segment 410-b to the segment 410-a. Alternatively, the gap 435 may be an unfilled space between the segment 410-a and the segment 410-b. As discussed herein, the gap 435 may be formed using any number of masking or etching processes, such as using a chop mask during the formation of the memory array. In some examples, the gap may not be in the middle of the access line 407 as illustrated (e.g., such that the segment 410-a and the segment 410-b are equal in length), and may instead be placed elsewhere in the memory architecture 400 (e.g., such that the segment 410-a and the segment 410-b are different in length).

In some cases, one or more layers between the access line 407 and the driver for the access line 407 may include one or more conductive (e.g., metal) routing lines, which may be referred to as interconnect layers or conductive layers. In the memory architecture 400, the interconnect layer may include interconnect layer segments 420, which may be examples of conductive lines (e.g., the interconnect layer segment 420-a may be an example of a first conductive line and the interconnect layer segment 420-b may an example of a second conductive line). An interconnect layer segment 420 may be included in a interconnect layer 320 as described elsewhere herein. For example, the interconnect layer 320 may include a corresponding set of interconnect layer segments 420 for each access line 407. For example, for an access line 407, the corresponding set of interconnect layer segments 420 may include a respective interconnect layer segment 420 for each segment 410 of the access line 407, with each segment 410 coupled with the respective interconnect layer segment 420 for the segment by one or more vias 415.

In some cases, the interconnect layer segments 420 of the corresponding set of interconnect layer segments 420 for an access line 407 may each be colinear. In some examples, the interconnect layer segments 420 may be lower than the segments 410 (e.g., the interconnect layer segments 420 may be between a substrate and the segments 410, where the interconnect layer segments 420 may be relatively closer to the substrate than the segments 410, among other examples). The interconnect layer segments 420 for an access line 407 may or may not be directly below the segments 410 of the access line (e.g., the via 415 may include or be coupled with one or more structures that extend in a horizontal direction such that an interconnect layer segment 420 coupled with a segment 410 need not necessarily be directly below the segment 410).

In some examples, a memory device may include different layers that include metal or other conductive lines, and metal lines with the same or different layers may extend in different directions, and an interconnection between a structure at one level of a device (e.g., a level that includes transistors 430) and a structure at another level of a device (e.g., an access line 407) may be coupled with each through interconnects that extend in different directions. Thus, one or more interconnect layer segments 420 may extend in a direction parallel to the access line 407 (e.g., in a horizontal direction), and additionally or alternatively, one or more interconnect layer segments 420 may extend in a direction orthogonal to the access line 407 (e.g., in a different horizontal direction).

As described herein, with reference to FIG. 3 for example, a driver for an access line 407 may be any circuitry configured to drive the line to a desired voltage and may include any number of transistors 430 or other circuitry components. In some cases, the driver may be coupled with or included in a corresponding decoder (e.g., a row decoder 120 or a column decoder 130). The driver may drive the access line segments 410 to a desired voltage using the interconnect layer segments 420 and the corresponding vias 415 (e.g., the via 415-a and the interconnect layer segment 420-a may electrically connect voltages or currents from the driver to the access line segment 410-a). The driver may be configured to apply a current and/or a voltage to the access lines of a memory cell as part of an access operation (e.g., the memory device, such as a memory controller 140, may operate the driver to select a word line 110 or a digit line 115 by applying a current and a voltage). In some examples, the driver may be an example of a word line driver or a bit line driver. Further, although discussed herein as below the interconnect layer segments 420, the driver may in some cases be located in various other physical configurations within or around the elements of memory architecture 400.

In some cases, the driver may include at least one transistor 430 for (e.g., coupled with) each access line segment 410 of an access line 407. Additionally or alternatively, the driver may include at least one transistor 430 for (e.g., coupled with) each interconnect layer segment 420. For example, as shown in FIG. 4, the driver may include a first transistor 430-a coupled with the first interconnect layer segment 420-a and the first segment 410-a, and a second transistor 430-b coupled with the second interconnect layer segment 420-b and the second segment 410-b. Each transistor 430 of the driver for an access line 407 may include a respective gate coupled to a common select signal 440 (e.g., the LSEL signal may be coupled to the gates of both the transistor 430-a and the transistor 430-b). The common select signal 440 may be used to concurrently activate or deactivate the transistors 430 so as to drive the segments 410 of the access line 407 to a common voltage. Though the transistors 430 may in some cases be part of the driver for an access line 407, the transistors 430 may alternatively be coupled with a separate driver circuit, and the transistors may serve to selectively couple and decouple the interconnect layer segments 420 (and thus the segments 410) from the driver. When an address corresponding to the access line 407 is associated with an access operation (e.g., for the memory cell 405-a), the transistors 430 coupled with the access line may be concurrently activated (e.g., based on the common select signal 440). For example, as described elsewhere herein, the segments 410 of an access line may not be individually addressable but may instead be concurrent activated or deactivated based on commands or operations addressed to the access line 407.

In the example schematic illustrated by the memory architecture 400, charge associated with a current spike through the target memory cell 405-a (e.g., due to a thresholding of the target memory cell 405-*a*) may flow through discharge paths 425, which may mitigate (e.g., reduce) the magnitude of the current spike through the memory cell 405-*a*. For example, internal charge that may build up on the access line 407 may follow the discharge paths 425 to discharge through the target memory cell 405-*a* to another access line coupled with the target memory cell 405-*a*. The other access line (not shown) may, for example, be a bit line if the access line 407 is a word line, or may be a word line if the access line 407 is a bit line.

The discharge path 425-*a* may illustrate a path taken by charge distributed on the segment 410-*a* of the access line before passing through the memory cell 405-*a*. The discharge path 425-*b* may illustrate a path taken by charge distributed on the segment 410-*b* (i.e., a segment not directly coupled with the memory cell 405-*a*) before passing through the memory cell 405-*a*.

As illustrated in the memory architecture 400, the discharge path 425-*b* may route from the segment 410-*b*, through the via 415-*b*, the interconnect layer segment 420-*b*, the transistor 430-*b*, the transistor 430-*a*, the interconnect layer segment 420-*a*, the via 415-*a*, and then through the segment 410-*a* before the current discharges through the memory cell 405-*a*. The extra ED and resistance introduced by the vias 415, the interconnect layer segments 420, and the transistors 430 may mitigate (e.g., reduce) the contribution of the charge associated with the segment 410-*b* to the discharge current through the memory cell 405-*a*. In some cases, the resistances of the transistors 430 may be configured by the common select signal 440 (e.g., the transistors 430 may be activated to a greater or lesser extent, and thus exhibit a higher or lower resistance, based on whether the voltage of the common select signal 440 is higher or lower.).

In some examples, the resistivity of the vias 415 may be different (e.g., higher) than the resistivity of the access line 407 (e.g., the resistivity of the segment 410-*a* and the segment 410-*b*). For example, the vias 415 may be made of one or more different materials than the access line, the vias 415 may have different physical properties (e.g., physical dimensions such as cross-sectional area), or both.

The discharge path 425-*b* may introduce a resistance ballast including the vias 415 and the layer 420. For example, the two vias 415, the two interconnect layer segments 420, the two transistors 430, or any combination thereof may serve as a relatively robust resistor ballast to reduce current spike across the memory cell 405-*a*. That is, due to the relatively long length and corresponding resistance of the discharge path 425-*b* (e.g., rather than charge flowing directly from the segment 410-*b* to the segment 410-*a*), current spikes through the memory cell 405-*a* may be reduced as some of the charge dissipates and/or discharges more slowly through the memory cell 405-*a* (e.g., such that an amplitude of the current discharge is reduced). By reducing the amplitude (e.g., peak amplitude, average amplitude) of current discharged through the memory cell 405-*a* when the memory cell 405-*a* is accessed, the lifespan of the memory cell 405-*a* may be extended and the chance of damage occurring to the memory cell 405-*a* may be reduced, among other benefits that may be apricated by one of ordinary skill in the art.

Figure 5:
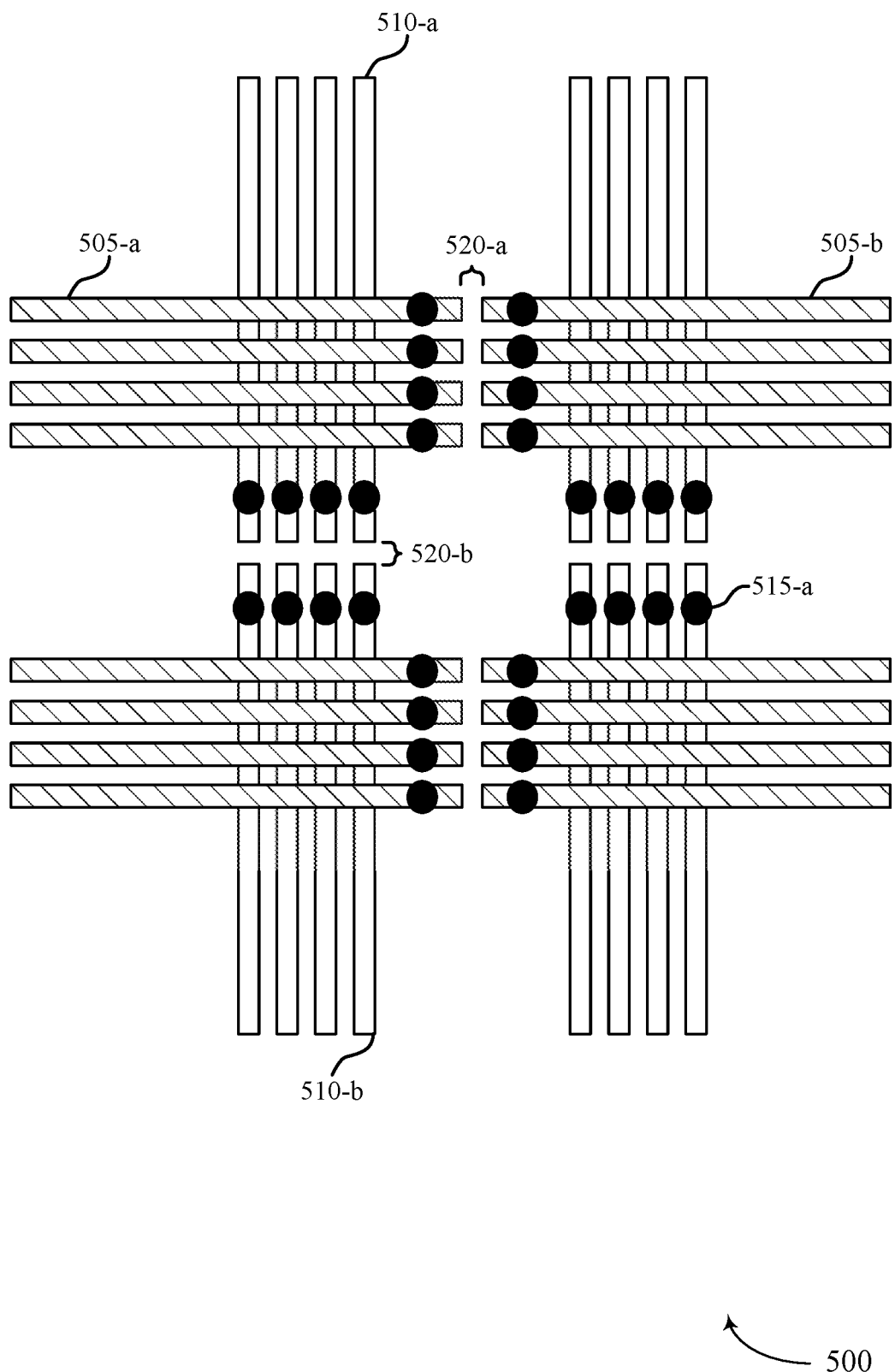

FIG. 5 illustrates an example of a memory architecture 500 that supports discharge current mitigation in a memory array in accordance with examples as disclosed herein. In some cases, the memory architecture 500 may implement one or more features of the memory device 100 as described with reference to FIG. 1, the memory array 200 as described with reference to FIG. 2, the memory architectures 300 as described with reference to FIG. 3, or the memory architectures 400 as described with reference to FIG. 4. The memory architecture 500 may show a top-down view schematic of a memory array that supports discharge current mitigation as described herein.

The memory architecture 500 may include access lines such as word lines and bit lines, which may be examples of word lines 110 and digit lines 115 as described with reference to FIGS. 1 and 2, respectively. The memory architecture 500 may include any number of access lines. As described herein, the access lines may be cut into segments (e.g., using a chop mask as described with reference to FIG. 3). For example, a word line segment 505-*a* and a word line segment 505-*b* may illustrate two segments of the same word line that has been cut (as indicated, for example, by the word line segment 505-*a* and the word line segment 505-*b* being aligned (e.g., collinear, coaxial). The word line segment 505-*a* and the word line segment 505-*b* may be separated by a gap 520-*a*. Likewise, the bit line segment 510-*a* and the bit line segment 510-*b* may illustrate a bit line that has been cut into two segments, where the segments are separated by a gap 520-*b*. In some examples, each word line or bit line may be cut into any number of segments, and the segments of a same access line may be equal or unequal in length.

As discussed with reference to FIG. 3 and FIG. 4, at least one respective via may couple each access line segment to a driver structure for the associated access line, with the driver structure common to all segments of the access line (e.g., vias 315 may couple each access line segment 310 to a layer 320, which may in turn couple the segment to a driver 330 as described with reference to FIG. 3; or at least one respective via 415, at least one respective layer segment 420, or both may couple each access line segment 410 to at least one respective transistor 430 either included in or coupled with a driver as described with reference to FIG. 4).

For example, each access line may be cut into segments (e.g., two segments) and each segment may have a driver contact 515. Driver contacts 515 may show the locations where the vias contact the access line segments (e.g., near the ends of segments and thus near the midpoint an access line, although other locations are possible such as near the midpoints of segments).

The memory architecture 500 may be configured to mitigate current discharge (e.g., current spikes) through memory cells coupled between the access lines. For example, a memory device may receive a command (e.g., from a host device) to perform an access operation for at least one memory cell coupled to one of the word lines and one of the bit lines illustrated by FIG. 5. A memory controller of the memory device may receive the command and use a driver structure to apply or adjust voltages of the access lines corresponding to the memory cell. Such voltage adjustments may be a part of an access operation, such as reading or writing the selected memory cell. When the voltage of an access line coupled with a selected memory cell is adjusted, the respective voltages of each segment of the access line may increase or decrease concurrently, due each segment being coupled with the same driver (the driver for the access line).

The driver structure may apply a voltage or a current to activate an access line coupled to a target memory cell (e.g., activating multiple segments of the access line). In some cases, the memory controller may select the access lines to activate based on an address of the access line indicated by the command (e.g., the physical address of the access line that includes the segments of the access line). Thus, the memory controller may select (i.e., access) the memory cell, some or all of the charge accompted in parasitic capacitance associated with the access line may discharge through the memory cell (e.g., via discharge paths 325 as described with reference to FIG. 3), for example, due to the memory cell becoming conductive based on the applied voltage or current from the driver structure. As described herein, discharging any built up charge of the access lines through the relatively longer and higher resistance discharge paths (e.g., the discharge paths described with reference to FIGS. 3 and 4) may result in a reduced current spike across the memory cell (e.g., due to the dissipation of charge and slower discharge across the memory cell). Additionally, such a configuration may have a relatively small impact on signal delivery (e.g., quality of signals used in access operations and the timing of access operations may be relatively unaffected by the segmented access line structure, while reducing the magnitude of potential current spikes).

Figure 6:
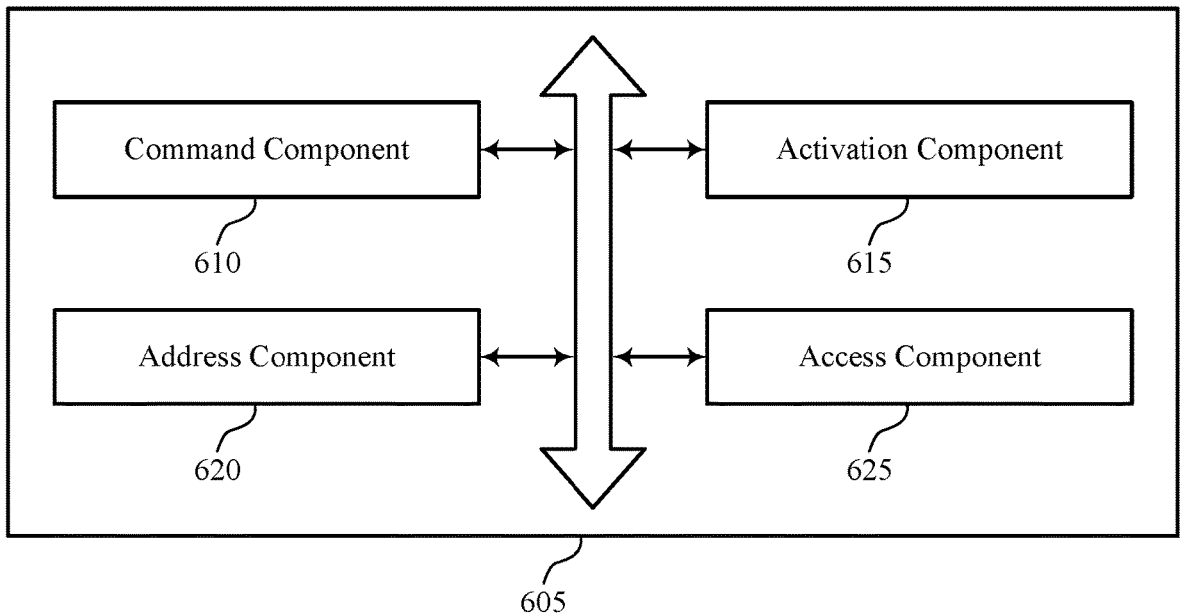
FIG. 6 shows a block diagram of a memory array that supports discharge current mitigation in a memory array in accordance with aspects of the present disclosure.

FIG. 6 shows a block diagram 600 of a memory array 605 that supports discharge current mitigation in a memory array in accordance with examples as disclosed herein. The memory array 605 may be an example of aspects of a memory array as described with reference to FIGS. 1-5. The memory array 605 may include a command component 610, an activation component 615, an address component 620, and an access component 625. Each of these modules may communicate, directly or indirectly, with one another (e.g., via one or more buses).

The command component 610 may receive a command to perform an access operation for a memory cell. In some examples, the command component 610 may receive a second command to perform a second access operation for a second memory cell included in the second set of memory cells.

The activation component 615 may activate, in response to the command, a first segment of an access line and a second segment of the access line, where the second segment is discontinuous with the first segment, the first segment is coupled with a first set of memory cells that includes the memory cell, and the second segment is coupled with a second set of memory cells that does not include the memory cell. In some examples, the activation component 615 may activate, in response to the second command, the second segment of the access line and the first segment of the access line. In some cases, the first segment is coupled with a driver via a first via. In some cases, the second segment is coupled with the driver via a second via. In some cases, the activating in response to the command includes concurrently adjusting a voltage of the first segment and a voltage of the second segment using the driver. In some cases, the activating in response to the second command includes concurrently adjusting a voltage of the second segment and a voltage of the first segment.

In some examples, the first segment is coupled with a driver by a first via and a conductive line, the first segment parallel to the conductive line, the second segment is coupled with the driver by a second via and the conductive line, the second segment parallel to the conductive line, and the activating in response to the command includes concurrently adjusting a voltage of the first segment and a voltage of the second segment using the driver.

In some examples, the driver comprises a first transistor and a second transistor, the first segment is coupled with the first transistor by a first via and a first conductive line, the first segment parallel to the first conductive line, the second segment is coupled with the second transistor by a second via and a second conductive line, the second segment parallel to the second conductive line, and the activating in response to the command includes concurrently activating the first transistor and the second transistor.

The access component 625 may perform the access operation based on the activating in response to the command. In some examples, the access component 625 may perform the second access operation based on the activating in response to the second command.

The address component 620 may identify an address of the access line based on the access command, where the activating in response to the command is based on the address of the access line.

Figure 7:
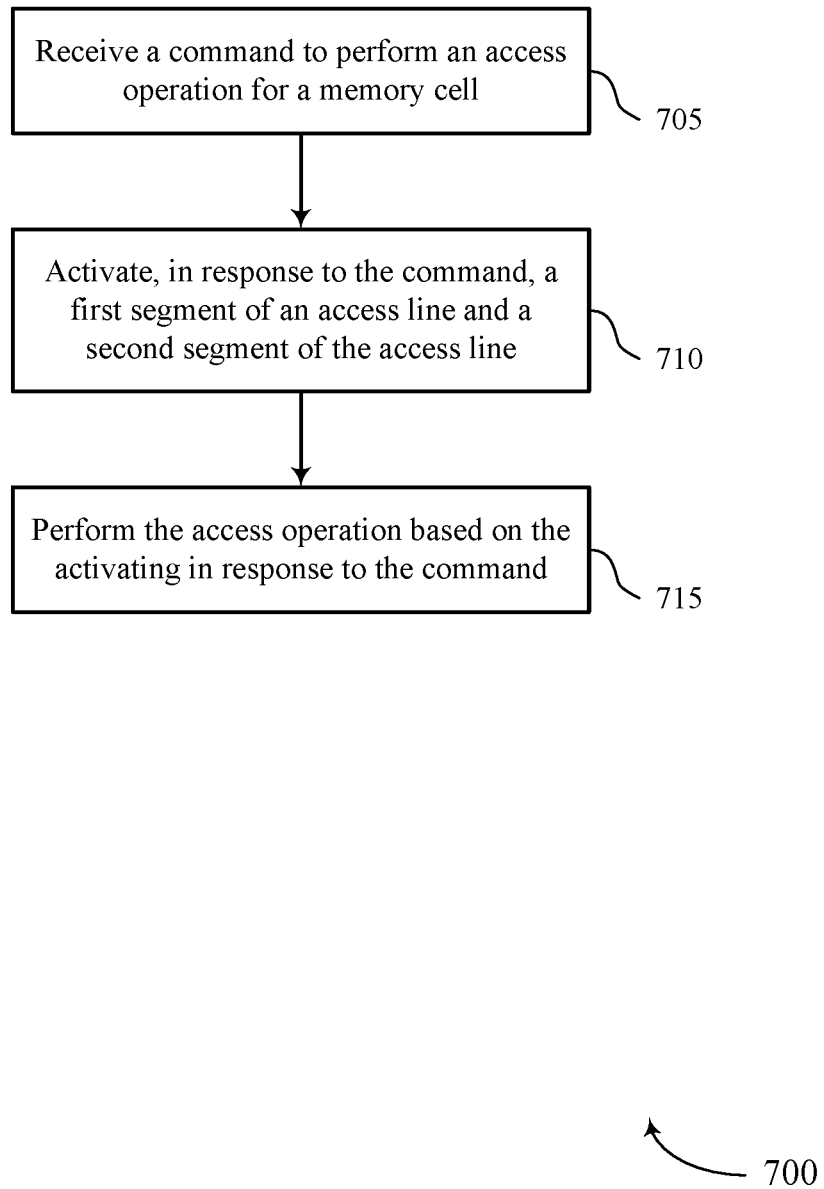
FIG. 7 shows a flowchart illustrating a method or methods that support discharge current mitigation in a memory array in accordance with examples as disclosed herein.

FIG. 7 shows a flowchart illustrating a method or methods 700 that supports discharge current mitigation in a memory array in accordance with aspects of the present disclosure. The operations of method 700 may be implemented by a memory array or its components as described herein. For example, the operations of method 700 may be performed by a memory array as described with reference to FIG. 6. In some examples, a memory array may execute a set of instructions to control the functional elements of the memory array to perform the described functions. Additionally or alternatively, a memory array may perform aspects of the described functions using special-purpose hardware.

At 705, the memory array may receive a command to perform an access operation for a memory cell. The operations of 705 may be performed according to the methods described herein. In some examples, aspects of the operations of 705 may be performed by a command component as described with reference to FIG. 6.

At 710, the memory array may activate, in response to the command, a first segment of an access line and a second segment of the access line. In some examples, the second segment is discontinuous with the first segment, the first segment is coupled with a first set of memory cells that includes the memory cell, and the second segment is coupled with a second set of memory cells that does not include the memory cell. The operations of 710 may be performed according to the methods described herein. In some examples, aspects of the operations of 710 may be performed by an activation component as described with reference to FIG. 6.

At 715, the memory array may perform the access operation based on the activating in response to the command. The operations of 715 may be performed according to the methods described herein. In some examples, aspects of the operations of 715 may be performed by an access component as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for receiving a command to perform an access operation for a memory cell, activating, in response to the command, a first segment of an access line and a second segment of the access line, and performing the access operation based on the activating in response to the command. In some examples, the second segment is discontinuous with the first segment, the first segment is coupled with a first set of memory cells that includes the memory cell, and the second segment is coupled with a second set of memory cells that does not include the memory cell.

Some examples of the method 700 and the apparatus described herein may further include operations, features, means, or instructions for identifying an address of the access line based on the access command, where the activating in response to the command may be based on the address of the access line.

In some examples of the method 700 and the apparatus described herein, the first segment may be coupled with a driver via a first via, the second segment may be coupled with the driver via a second via, and the activating in response to the command includes concurrently adjusting a voltage of the first segment and a voltage of the second segment using the driver.

Some examples of the method 700 and the apparatus described herein may further include operations, features, means, or instructions for receiving a second command to perform a second access operation for a second memory cell included in the second set of memory cells, activating, in response to the second command, the second segment of the access line and the first segment of the access line, and performing the second access operation based on the activating in response to the second command.

In some examples of the method 700 and the apparatus described herein, the activating in response to the second command includes concurrently adjusting a voltage of the second segment and a voltage of the first segment.

In some examples of the method 700 and the apparatus described herein, the first segment is coupled with a driver by a first via and a conductive line, the first segment parallel to the conductive line, the second segment is coupled with the driver by a second via and the conductive line, the second segment parallel to the conductive line, and the activating in response to the command includes concurrently adjusting a voltage of the first segment and a voltage of the second segment using the driver.

In some examples of the method 700 and the apparatus described herein, the driver comprises a first transistor and a second transistor, the first segment is coupled with the first transistor by a first via and a first conductive line, the first segment parallel to the first conductive line, the second segment is coupled with the second transistor by a second via and a second conductive line, the second segment parallel to the second conductive line, and the activating in response to the command includes concurrently activating the first transistor and the second transistor.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a first segment of an access line, the first segment coupled with a first set of memory cells, a second segment of the access line, the second segment separate from the first segment and coupled with a second set of memory cells, and a driver coupled with the first segment and with the second segment.

Some examples of the apparatus may include a first via coupled with the first segment, where the driver may be coupled with the first segment by the first via, and a second via coupled with the second segment, where the driver may be coupled with the second segment by the second via.

Some examples of the apparatus may include a conductive line below the first segment and the second segment, where the first via, the second via, and the driver may be each coupled with the conductive line.

Some examples of the apparatus may include a first conductive line below the first segment and a second conductive line below the second segment, where the first via is coupled with the first conductive line and the second via is coupled with the second conductive line.

In some examples, the driver includes a first transistor coupled with the first conductive line and a second transistor coupled with the second conductive line.

In some examples, a gate of the first transistor is coupled with a gate of the second transistor.

In some examples, the first segment and the second segment both may have a first resistivity, and the first via and the second via both may have a second resistivity that may be greater than the first resistivity.

In some examples, the first via may be coupled with the first segment at a first location nearer an end of the first segment than a midpoint of the first segment, and the second via may be coupled with the second segment at a second location nearer an end of the second segment than a midpoint of the second segment.

In some examples, the first segment and the second segment may be at a same layer (e.g., level) of the apparatus, and the first segment and the second segment may be separated by a gap at the same layer (e.g., level).

Some examples of the apparatus may include a dielectric material between the first segment and the second segment at a first layer (e.g., level) that includes the first segment and the second segment, where the first segment may be coupled with the second segment at a second layer (e.g., level) that may be below the first layer (e.g., level).

In some examples, the second segment may be collinear with the first segment. In some examples, the first segment and the second segment may be equal in length. In some examples, the first segment and the second segment may be unequal in length.

Some examples of the apparatus may include one or more additional segments of the access line, each additional segment of the access line colinear with the first segment and the second segment, and each additional segment of the access line coupled with the driver and with a corresponding additional set of memory cells.

In some examples, the driver may be operable to concurrently activate the first segment and the second segment to access a memory cell in either the first set of memory cells or the second set of memory cells.

In some examples, the access line may have an address, the memory cells of the first set and the memory cells of the second set both accessible based on the address, and the driver may be operable to adjust a voltage of the first segment and a voltage of the second segment based on an access command associated with the address.

In some examples, the memory cells of the first set and the second set each include a chalcogenide material.

An apparatus is described. The apparatus may include a set of memory cells arranged into rows and columns, a set of word lines that are each coupled with a respective row of memory cells, and a set of bit lines that are each coupled with a respective column of memory cells, where each word line includes a set of discontinuous word line segments, each word line segment coupled with a respective subset of the respective row of memory cells and each bit line includes a set of discontinuous bit line segments, each bit line segment coupled with a respective subset of the respective column of memory cells.

Some examples of the apparatus may include a set of drivers each coupled with a respective word line or a respective bit line by a respective set of vias.

In some examples, each via of the respective set of vias may be coupled with a respective word line segment of a same word line or a respective bit line segment of a same bit line.

In some examples, each driver of the plurality of drivers includes a respective plurality of transistors, each transistor of the respective plurality of transistors is coupled with a respective via of the respective plurality of vias, and each transistor of the respective plurality of transistors is configured to be concurrently activated or deactivated.

In some examples, the set of word line segments included in a word line may be collinear, and the set of bit line segments included in a bit line may be collinear.

In some examples, the set of word line segments included in the word line may be separated by first gaps at a same layer (e.g., level) as the word line, and the set of bit line segments included in the bit line may be separated by second gaps at a same layer (e.g., level) as the bit line.

In some examples, the set of word line segments included in a word line each correspond to a same word line address, and the set of bit line segments included in a bit line each correspond to a same bit line address.

Some examples of the apparatus may include a set of word line drivers each coupled with a respective word line, a set of bit line drivers each coupled with a respective bit line, and a controller coupled with the set of word line drivers and the set of bit line drivers, where the controller may be operable to cause the apparatus to identify an access operation for a memory cell coupled with one word line segment included in a word line and one bit line segment included in a bit line, activate, using a same word line driver, each of the plurality of word line segments included in the word line based at least in part on identifying the access operation, and activate, using a same bit line driver, each of the plurality of bit line segments included in the bit line based at least in part on identifying the access operation.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
  a first segment of an access line, the first segment coupled with a first set of memory cells;
  a second segment of the access line, the second segment separate from the first segment and coupled with a second set of memory cells, wherein the first segment and the second segment are at a same layer of the apparatus and are coupled by a plurality of vias and at least one conductive line; and
  a driver coupled with the first segment and the second segment.

2. The apparatus of claim 1, further comprising:
a first via coupled with the first segment, wherein the driver is coupled with the first segment by the first via; and
a second via coupled with the second segment, wherein the driver is coupled with the second segment by the second via.

3. The apparatus of claim 2, wherein the at least one conductive line comprises:
a conductive line lower than the first segment and the second segment, wherein the first via and the second via are coupled with the conductive line, and wherein the driver comprises a transistor lower than and coupled with the conductive line.

4. The apparatus of claim 2, wherein the at least one conductive line comprises:
a first conductive line lower than the first segment and a second conductive line lower than the second segment, wherein the first via is coupled with the first conductive line and the second via is coupled with the second conductive line.

5. The apparatus of claim 4, wherein the driver comprises a first transistor coupled with the first conductive line and a second transistor coupled with the second conductive line.

6. The apparatus of claim 5, wherein a gate of the first transistor is coupled with a gate of the second transistor.

7. The apparatus of claim 2, wherein:
the first segment and the second segment both have a first resistivity; and
the first via and the second via both have a second resistivity that is greater than the first resistivity.

8. The apparatus of claim 2, wherein:
the first via is coupled with the first segment at a first location nearer an end of the first segment than a midpoint of the first segment; and
the second via is coupled with the second segment at a second location nearer an end of the second segment than a midpoint of the second segment.

9. The apparatus of claim 1, wherein:
the first segment and the second segment are separated by a gap at the same layer.

10. The apparatus of claim 1, further comprising:
a dielectric material between the first segment and the second segment at a first level that includes the first segment and the second segment, wherein the first segment is coupled with the second segment at a second level that is lower than the first level.

11. The apparatus of claim 1, further comprising:
one or more additional segments of the access line, each additional segment of the access line colinear with the first segment and the second segment, and each additional segment of the access line coupled with the driver and with a corresponding additional set of memory cells.

12. The apparatus of claim 1, wherein the driver is operable to concurrently activate the first segment and the second segment to access a memory cell in either the first set of memory cells or the second set of memory cells.

13. The apparatus of claim 1, wherein:
the access line has an address;
the memory cells of the first set and the memory cells of the second set are both accessible based at least in part on the address; and
the driver is operable to adjust a voltage of the first segment and a voltage of the second segment based at least in part on an access command associated with the address.

14. A method, comprising:
receiving a command to perform an access operation for a memory cell;
activating, in response to the command, a first segment of an access line and a second segment of the access line that is discontinuous with the first segment, wherein the first segment is coupled with a first set of memory cells that includes the memory cell, wherein the second segment is coupled with a second set of memory cells that does not include the memory cell, and wherein the first segment and the second segment are at a same layer and are coupled by a plurality of vias and at least one conductive line; and
performing the access operation based at least in part on the activating in response to the command.

15. The method of claim 14, wherein:
the first segment is coupled with a driver by a first via and the at least one conductive line, the first segment parallel to the at least one conductive line;
the second segment is coupled with the driver by a second via and the at least one conductive line, the second segment parallel to the at least one conductive line; and
the activating in response to the command comprises concurrently adjusting a voltage of the first segment and a voltage of the second segment using the driver.

16. The method of claim 14, wherein:
the at least one conductive line comprises a first conductive line and a second conductive line;
the first segment is coupled with a first transistor of a driver by a first via and the first conductive line, the first segment parallel to the first conductive line;
the second segment is coupled with a second transistor of the driver by a second via and the second conductive line, the second segment parallel to the second conductive line; and
the activating in response to the command comprises concurrently activating the first transistor and the second transistor.

17. The method of claim 14, further comprising:
receiving a second command to perform a second access operation for a second memory cell included in the second set of memory cells;
activating, in response to the second command, the second segment of the access line and the first segment of the access line; and
performing the second access operation based at least in part on the activating in response to the second command.

18. An apparatus, comprising:
a plurality of memory cells arranged into rows and columns;
a plurality of word lines that are each coupled with a respective row of memory cells;
a plurality of bit lines that are each coupled with a respective column of memory cells, wherein:
each word line comprises a plurality of discontinuous word line segments, each word line segment coupled with a respective subset of the respective row of memory cells;
each bit line comprises a plurality of discontinuous bit line segments, each bit line segment coupled with a respective subset of the respective column of memory cells;
the plurality of discontinuous word line segments or the plurality of discontinuous bit line segments are at a same respective layer of the apparatus; and the plurality of discontinuous word line segments or the plurality of discontinuous bit line segments are coupled by a plurality of vias and by at least one conductive line.

19. The apparatus of claim 18, further comprising:
a plurality of drivers each coupled with a respective word line or a respective bit line by a respective plurality of vias, wherein each via of the respective plurality of vias is coupled with a respective word line segment of a same word line or a respective bit line segment of a same bit line.

20. The apparatus of claim 19, wherein:
each driver of the plurality of drivers comprises a respective plurality of transistors;
each transistor of the respective plurality of transistors is coupled with a respective via of the respective plurality of vias; and
each transistor of the respective plurality of transistors is configured to be concurrently activated or deactivated.

* * * * *